United States Patent
Lee

(10) Patent No.: US 7,167,990 B2
(45) Date of Patent: Jan. 23, 2007

(54) INTERFACING CIRCUIT FOR REDUCING CURRENT CONSUMPTION

(75) Inventor: Ik-joo Lee, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 441 days.

(21) Appl. No.: 10/786,406

(22) Filed: Feb. 25, 2004

(65) Prior Publication Data

US 2004/0170051 A1    Sep. 2, 2004

(30) Foreign Application Priority Data

Feb. 28, 2003    (KR)    ...................... 10-2003-0012809

(51) Int. Cl.
G06F 1/26        (2006.01)

(52) U.S. Cl. ...................... 713/310; 713/320; 365/227

(58) Field of Classification Search ................ 713/300, 713/600, 310, 320; 365/154, 227
See application file for complete search history.

(56) References Cited

U.S. PATENT DOCUMENTS

| | | | |
|---|---|---|---|
| 5,559,738 A * | 9/1996 | Mizobata et al. | 365/189.01 |
| 5,668,760 A | 9/1997 | Hazen | 365/189.01 |
| 6,172,935 B1 * | 1/2001 | Wright et al. | 365/233 |
| 6,175,905 B1 * | 1/2001 | Manning | 711/169 |
| 6,363,454 B1 * | 3/2002 | Lakhani et al. | 711/100 |
| 6,414,894 B2 * | 7/2002 | Ooishi et al. | 365/222 |
| 6,462,997 B2 * | 10/2002 | Sugamoto et al. | 365/203 |
| 6,798,707 B2 * | 9/2004 | Niwa et al. | 365/221 |

FOREIGN PATENT DOCUMENTS

KR    2000-015301    3/2000

OTHER PUBLICATIONS

Venkatesh et al., "TP 2.7: A 55ns 0.35um 5V-only 16 M Flash Memory with Deep-power Down", 1996 IEEE international Solid State Circuit Conference, Digest of Technical Papers, pp. 44-45, 415.*

* cited by examiner

Primary Examiner—Chun Cao
(74) Attorney, Agent, or Firm—Mills & Onello LLP

(57) ABSTRACT

An interfacing circuit for reducing current consumption includes a command decoder, an operation controller, and a transmission controller. The command decoder decodes input packet commands and generates corresponding commands. The operation controller generates first through N-th operation signals for performing operations corresponding to the commands in response to a clock signal. The transmission controller transmits the first through N-th operation signals as first through N-th control signals in response to the clock signal. The transmission controller comprises a reset signal generator which generates a reset signal for interrupting the transmission of the first control signal when multiple commands of the first through N-th commands are generated simultaneously, wherein the commands would otherwise incorrectly operate the circuit receiving the first through N-th control signals when the commands are generated simultaneously. In this manner, the interfacing circuit offers the advantage that excessive current does not flow to the memory device, in the event that multiple commands are transmitted simultaneously.

13 Claims, 6 Drawing Sheets

ROWA PACKET

ROWR PACKET (PRIOR ART)
FIG. 2

| DM | AV | ROP10..ROP0 Field ||||||||||| Name | Command Description |
|---|---|---|---|---|---|---|---|---|---|---|---|---|---|
| | | 10 | 9 | 8 | 7 | 6 | 5 | 4 | 3 | 2:0 | | |
| 0 | 0 | - | - | - | - | - | - | - | - | ... | - | No operation. |
| 1 | 1 | across Row address ||||||||| ACT | Activate row R8..R0 of bank BR4..BR0 of device and move device to ATTN. |
| 1 | 0 | 1 | 1 | 0 | 0 | 0 | x | x | x | 000 | PRER | Precharge bank BR4..BR0 of this device. |
| 1 | 0 | 0 | 0 | 0 | 1 | 1 | 0 | 0 | x | 000 | REFA | Refresh (activate) row REFR8..REFR0 of bank BR4..BR0 of device. Increment REFR if BR4..BR0 = 1111 (see Figure). |
| 1 | 0 | 1 | 0 | 0 | 1 | 0 | 0 | 0 | x | 000 | REFP | Precharge bank BR4..BR0 of this device after REFA (see Figure). |
| 1 | 0 | 0 | 0 | 1 | 0 | 0 | 1 | 1 | x | 000 | PDNR | Move this device into the powerdown (PDN) power state (see Figure). |
| 1 | 0 | 0 | 0 | 0 | 0 | 0 | 1 | 0 | x | 000 | NAPR | Move this device into the nap (NAP) power state (see Figure). |
| 1 | 0 | x | x | 0 | 0 | 0 | 1 | 1 | x | 000 | NAPRC | Move this device into the nap (NAP) power state conditionally |
| 1 | 0 | x | x | x | x | x | x | x | 0 | 000 | ATTN | Move this device into the attention (ATTN) power state (see Figure). |
| 1 | 0 | x | x | x | x | x | x | x | 1 | 000 | RLXR | Move this device into the standby (STBY) power state (see Figure). |
| 1 | 0 | 0 | 0 | 0 | 0 | 0 | 0 | 0 | x | 001 | TCAL | Temperature calibrate this device (see Figure). |
| 1 | 0 | 0 | 0 | 0 | 0 | 0 | 0 | 0 | x | 010 | TCEN | Temperature calibrate/enable this device (see Figure). |
| 1 | 0 | 0 | 0 | 0 | 0 | 0 | 0 | 0 | 0 | 000 | NOROP | No operation. |

COMMAND LIST OF ROWR PACKETS (COMMAND LIST)

INTERFACING CIRCUIT FOR REDUCING CURRENT CONSUMPTION

BACKGROUND OF THE INVENTION

This application claims the priority of Korean Patent Application No. 2003-12809, filed on Feb. 28, 2003, in the Korean Intellectual Property Office, the disclosure of which is incorporated herein in its entirety by reference.

1. Field of the Invention

The present invention relates to a semiconductor memory device, and more particularly to an interfacing circuit, which is located between external input pins and a memory core of a semiconductor memory device, for reducing current consumption of the semiconductor memory device.

2. Description of the Related Art

A semiconductor memory device that receives a packet-type command from an external controller to perform operations in accordance with the command decodes the packet-type command and performs operations corresponding to the decoded result.

In the case where a command is input from the external controller, for example, in the case where a plurality of commands are input simultaneously, a general semiconductor memory device decodes the plurality of commands unconditionally and performs the operations corresponding to the decoded result.

FIG. 1A is a timing chart illustrating row activation packets among the packet commands used in the semiconductor memory device.

FIG. 1B is a timing chart illustrating row command packets among the packet commands used in the semiconductor memory device.

Referring to FIGS. 1A and 1B, in this example, four cycles of a clock signal CTM/CFM constitute one packet command. That is, commands input during the four cycles are collected to form one command for performing a single operation.

FIG. 1A shows a row activation packet containing information related to a number of a device to be accessed and a bank address as well as a row address to be accessed. DR represents the number of the device to be accessed, BR represents the bank address to be accessed, and R represents the row address to be accessed.

FIG. 1B shows a row command packet containing information related to a command, such as an activation command, or a precharge command, and the like.

FIG. 2 is an example of a command list of the row command packets.

The external memory controller of the semiconductor memory device sends the command defined in the command list of FIG. 2 to the semiconductor memory device, and the semiconductor memory device performs the operations corresponding to the received command.

FIG. 3 is a block diagram of a conventional interfacing circuit that decodes packet commands and controls a semiconductor memory device.

A command decoder 310 decodes a packet command input from the memory controller (not shown) and outputs a corresponding command. The input packet command is one among the commands defined in the command list of FIG. 2.

For example, if a packet command for sensing the memory cells of the memory core, such as a refresh command, is input, a corresponding master signal REFA is generated at a high level. Then, a control signal REFA_CTRL at a high level for sensing the memory cells is generated from a flip-flop 340 following one clock of the clock signal CLK. In this case, the remaining master signals PRER and REFP stay in a non-activated state.

However, in the case where a plurality of commands among the commands defined in the command list of FIG. 2 are generated simultaneously with the refresh command and input to the semiconductor memory device, the semiconductor memory device attempts to decode the plurality of commands and perform the corresponding operations. As a result, the semiconductor memory device operates incorrectly and consumes a large amount of electrical current by attempting to simultaneously process the commands and the refresh operation, thereby adversely affecting the performance of the entire memory system and the semiconductor memory device.

SUMMARY OF THE INVENTION

The present invention provides an interfacing circuit capable of preventing excessive current from flowing to a semiconductor memory device, in the case where non-defined commands are input from a memory controller to the semiconductor memory device.

According to one aspect of the present invention, there is provided an interfacing circuit including a command decoder, an operation controller, and a transmission controller. The command decoder decodes input packet commands and generates corresponding commands. The operation controller generates first through N-th operation signals for performing operations corresponding to the commands in response to a clock signal. The transmission controller transmits the first through N-th operation signals as first through N-th control signals, in response to the clock signal. The transmission controller comprises a reset signal generator which generates a reset signal for cutting off, or interrupting, the transmission of the first control signal, when multiple commands of the first through N-th commands are generated simultaneously.

In one embodiment, the operation controller comprises first through N-th operation units which receives first through N-th command outputs from the command decoder and generates the first through N-th operation signals.

In another embodiment, each of the first through N-th operation units comprises a master signal generator that receives and outputs a corresponding command as master signals in response to the clock signal, and a combinational logic unit that generates a corresponding operation signal in response to the master signal.

In another embodiment, the reset signal generator comprises a first switching unit, a second switching unit, a third switching unit, and a reset controller. The first switching unit connects a first node with a source voltage in response to an inverted signal of the first master signal. The second switching unit connects a second node with a ground voltage in response to the first master signal. The third switching unit connects the first node to the second node when any of the master signals other than the first master signal is activated. The reset controller generates the reset signal when any of the master signals other than the first master signal is activated simultaneously with the first master signal, in response to a signal at the first node, the inverted signal of the first master signal, and a reset control signal.

In another embodiment, the first switching unit is a PMOS transistor having a gate to which the inverted signal of the first master signal is applied, and the second switching unit is an NMOS transistor having a gate to which the first master signal is applied.

In another embodiment, the third switching unit comprises a plurality of NMOS transistors, each having a gate to which a respective master signal is applied, and which are connected in a parallel manner between the first node and the second node.

In another embodiment, the reset controller comprises a NOR means which performs a NOR operation of a signal at the first node and an inverted signal of the first master signal to be output as a reset signal, a first between an output node of the NOR means and the first node which reverses the reset signal to apply to the first node, and an NMOS transistor which connects the output node of the NOR means to a ground voltage in response to the reset control signal.

In another embodiment, the first master signal, the first operation signal, and the first control signal are the same signal that activates a sensing operation of a memory core. The circuit receiving the first through N-th control signals is the memory core of a semiconductor memory device.

In another embodiment, the transmission controller comprises first through N-th flip-flops that output the first through N-th operation signals as the first through N-th control signals in response to the clock signal. The interfacing circuit may be installed, for example, in a Rambus DRAM.

In another embodiment, the commands incorrectly operate a circuit receiving the first through N-th control signals when the multiple commands are generated simultaneously, if the transmission of the first control signal was activated.

In another embodiment, the first control signal activates a sensing operation of a memory core.

BRIEF DESCRIPTION OF THE DRAWINGS

The above and other features and advantages of the present invention will become more apparent by describing in detail exemplary embodiments thereof with reference to the attached drawings in which:

FIG. 2 is an example of a command list of row command packets;

DETAILED DESCRIPTION OF PREFERRED EMBODIMENTS

Hereinafter, embodiments of the present invention will be described in detail with reference to the appended drawings, wherein the same reference number used in the respective drawings represents the same component.

Figure 1A:
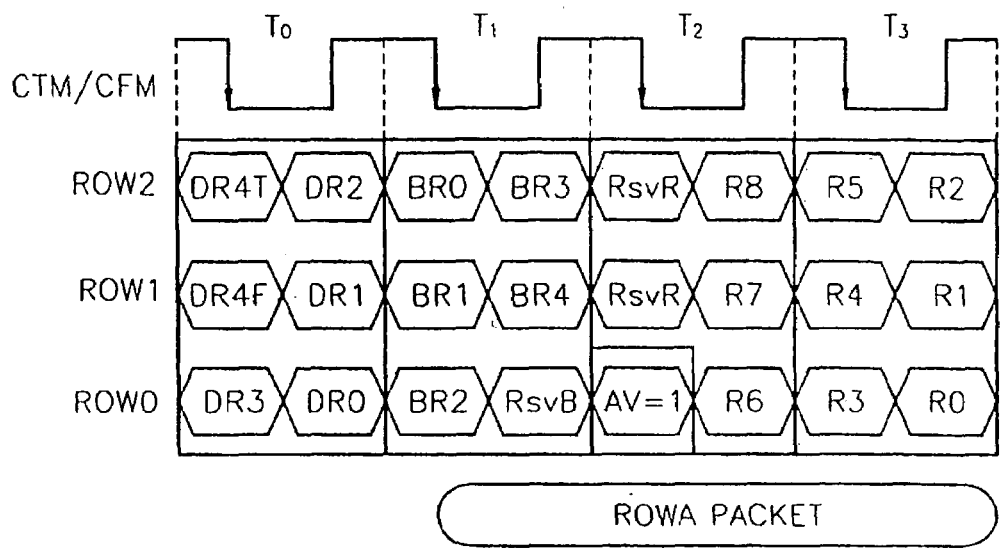
FIG. 1A is a timing diagram illustrating row activation packets among packet commands used in a semiconductor memory device.
Figure 1B:
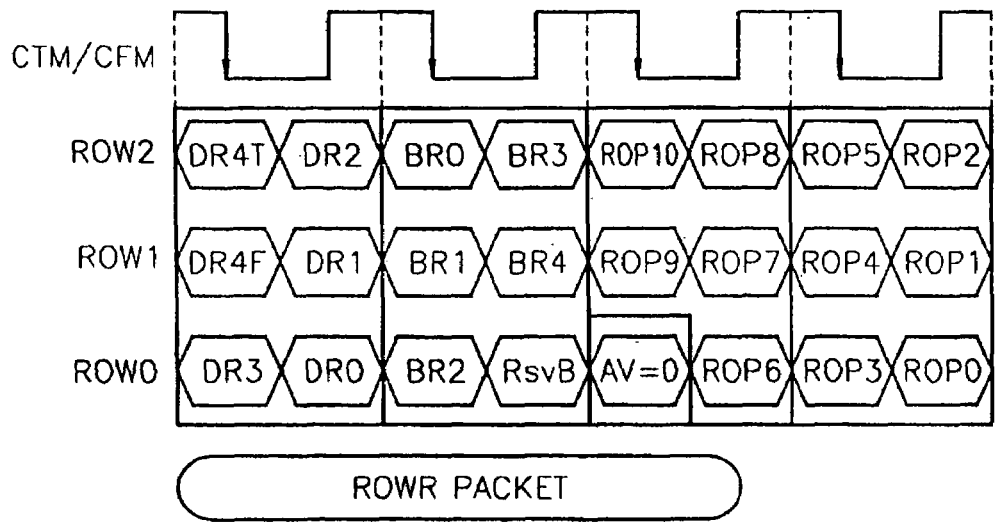
FIG. 1B is a timing diagram illustrating row command packets among the packet commands used in the semiconductor memory device.
Figure 3:
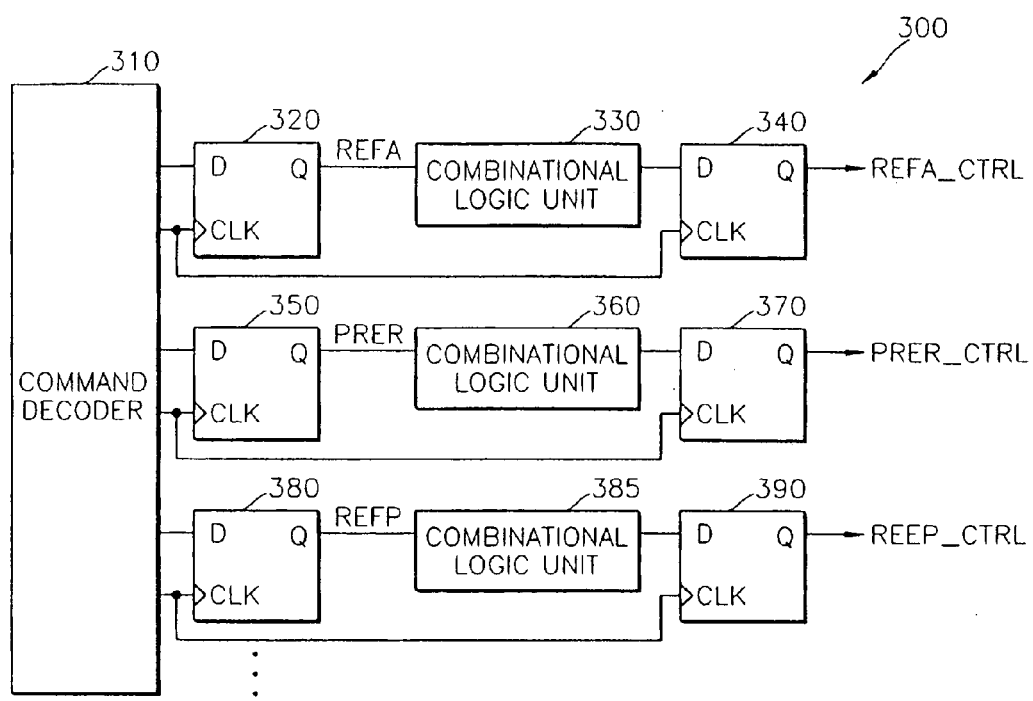
FIG. 3 is a block diagram of a conventional interfacing circuit that decodes packet commands and controls a semiconductor memory device.
Figure 4:
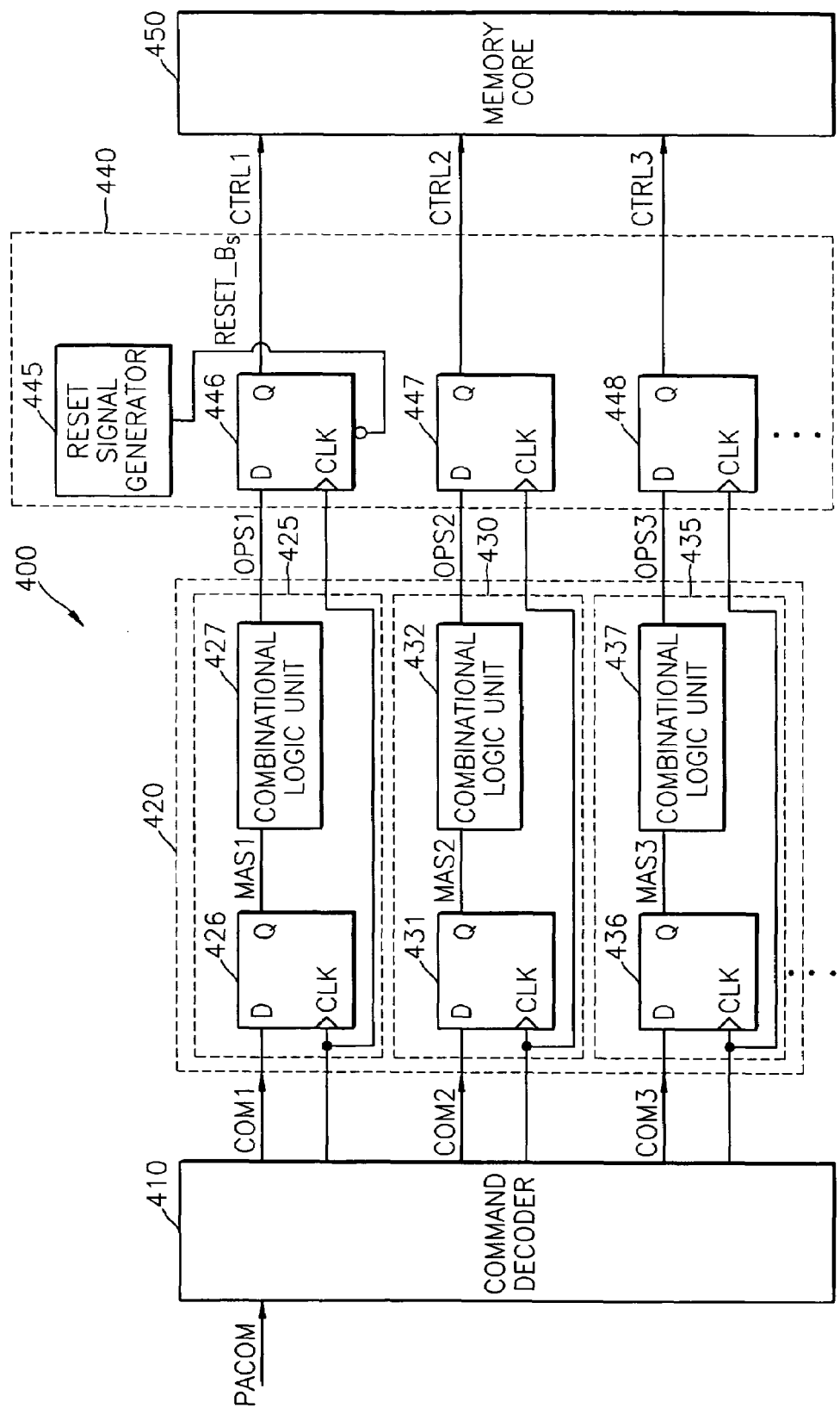
FIG. 4 is a block diagram of an interfacing circuit according to the present invention.
Figure 5:
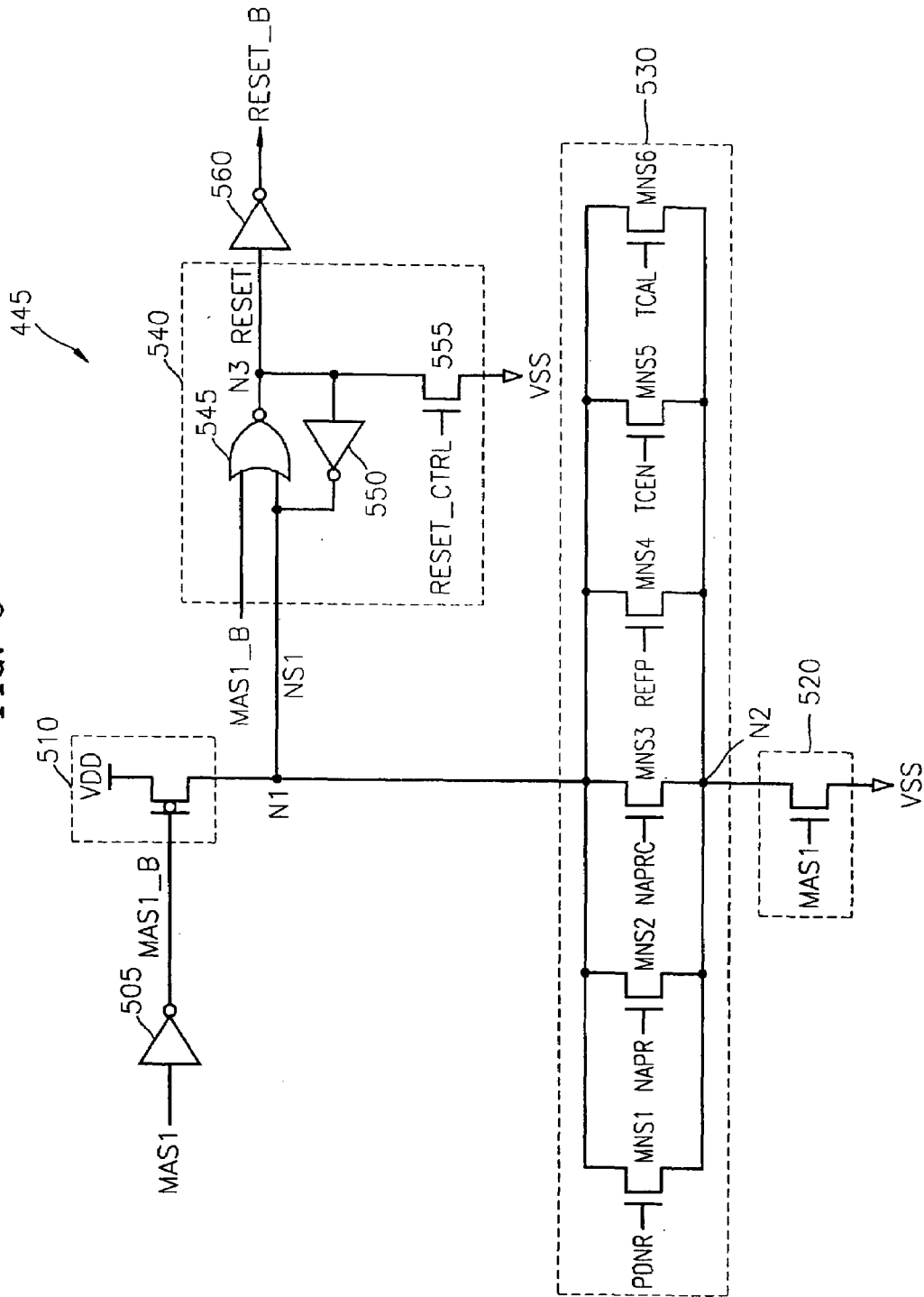
FIG. 5 is a circuit diagram of the reset signal generator of FIG. 4.

FIG. 4 is a block diagram of an interfacing circuit according to the present invention. FIG. 5 shows a circuit diagram of the reset signal generator of FIG. 4.

An interfacing circuit 400 comprises a command decoder 410, an operation controller 420, and a transmission controller 440.

The command decoder 410 decodes an input packet command PACOM and generates corresponding commands COM1 through COM3.

The operation controller 420 generates first through N-th operation signals OPS1, OPS2, and OPS3 for performing operations corresponding to the commands COM1 through COM3 in response to a clock signal CLK.

More specifically, the operation controller 420 comprises first through N-th operation units 425, 430, and 435 each of which receives the first through N-th commands COM1 through COM3 output from the command decoder 410, respectively, and generates the first through N-th operation signals OPS1, OPS2, and OPS3, respectively.

The first through N-th operation units 425, 430, and 435 comprise master signal generators 426, 431, and 436 which receive and output the corresponding commands COM1 through COM3 as master signals MAS1, MAS2, and MAS3, respectively, in response to the clock signal CLK, and combination logic units 427, 432, and 437 which generate corresponding operation signals OPS1, OPS2, and OPS3, respectively, in response to the master signals MAS1, MAS2, and MAS3.

The transmission controller 440 transmits the first through N-th operation signals OPS1, OPS2, and OPS3 as first through N-th control signals CTRL1, CTRL2, and CTRL3 to the next circuit, for example, memory core 450, in response to the clock signal CLK. The transmission controller 440 comprises a reset signal generator 445 which generates a reset signal for cutting off the first control signal CTRL1 from being transmitted to the next circuit, when commands are generated simultaneously, wherein the commands incorrectly operate the circuit receiving the first through N-th control signals CTRL1, CTRL2, and CTRL3 when the commands are generated simultaneously.

The reset signal generator 445 includes a first switching unit 510, a second switching unit 520, a third switching unit 530, and a reset controller 540 as shown in FIG. 5.

The first switching unit 510 connects a source voltage VDD with a first node N1 in response to an inverted signal MAS1_B of the first master signal MAS1. The first switching unit 510, in this example, is a PMOS transistor having a gate to which an inverted signal MAS1_B of the first master signal MAS1 is applied.

The second switching unit 520 connects a ground voltage VSS with a second node N2 in response to the first master signal MAS1. The second switching unit 520 is, in this example, an NMOS transistor having a gate to which the first master signal MAS1 is applied.

The third switching unit 530 connects the first node N1 with the second node N2 when the master signals are activated, in the case where the master signals incorrectly operate the circuit 450 receiving the first through N-th control signals CTRL1, CTRL1, and CTRL3 when the master signals are activated simultaneously with the first master signal MAS1. In this case, the circuit 450 receiving the first through N-th control signals CTRL1, CTRL2, and CTRL3 is the memory core of a semiconductor memory device.

The third switching unit 530, in this example, comprises a plurality of NMOS transistors MNS1 through MNS6 having gates to which the master signals are applied, respectively, and which are connected in a parallel manner between the first node and the second node, wherein the master signals incorrectly operate the circuit 450 receiving the first through N-th control signals CTRL1, CTRL2, and CTRL3 when the master signals are activated simultaneously with the first master signal MAS1.

The reset controller 540 generates a reset signal RESET when master signals, for example, master signals PDNR, NAPR, NAPRC, REFP, TCEN, and TCAL, are activated simultaneously with the first master signal MAS1, wherein the master signals incorrectly operate the circuit 450 receiving the first through N-th control signals CTRL1, CTRL2, and CTRL3 when the master signals are activated simultaneously with the first master signal MAS1, in response to a signal NS1 output from the first node N1, the inverted signal MAS1_B of the first master signal MAS1, and a reset control signal RESET_CTRL.

More specifically, the reset controller 540, in this example, comprises a NOR means 545 which performs a NOR operation of a signal NS1 output from the first node N1 and the inverted signal MAS1_B of the first master signal MAS1 to be output as a reset signal RESET, a first inverter 550 which inverts the reset signal RESET to apply to the first node N1, and an NMOS transistor 555 which connects an output node N3 of the NOR means 545 with the ground voltage VSS in response to the reset control signal RESET_CTRL.

In this example, the first master signal MAS1, the first operation signal OPS1, and the first control signal CTRL1 are the same signal that activate a sensing operation of the memory core 450, for example a refresh operation of the memory core.

Returning to FIG. 4, the transmission controller 440 comprises first through N-th flip-flops 446, 447, and 448 which output the first through N-th operation signals OPS1, OPS2, and OPS3 as the first through N-th control signals CTRL1, CTRL2, and CTRL3, respectively, in response to the clock signal CLK. The interfacing circuit 400 is applicable to installation in a number of different memory platforms, for example, in a Rambus DRAM platform.

Hereinafter, the operations of the interfacing circuit according to the present invention will be described in detail with reference to FIGS. 4 and 5.

The interfacing circuit 400 according to the present invention includes the command decoder 410, the operation controller 420, and the transmission controller 440.

The command decoder 410 decodes the input packet command PACOM and generates the corresponding commands COM1 through COM3. If one packet command PACOM is input, one corresponding command is generated, and if a plurality of packet commands are input, a plurality of corresponding commands are generated.

The generated commands are applied to a corresponding operation unit of the operation controller 420. For example, if a packet command among the commands defined in FIG. 2, such as a refresh command which senses the current of the memory cells of the memory core, is input, the command decoder 410 decodes the packet command and outputs a first command COM1.

The first operation unit 425 of the operation controller 420 receives the first command COM1 and generates a first operation signal OPS1. The first operation unit 425 comprises a first master signal generator 426 which receives and outputs the first command COM1 in response to the clock signal CLK as a first master signal MAS1, and a combinational logic unit 427 which receives the first master signal MAS1 and generates a corresponding first operation signal OPS1.

The other operation units 430 and 435 have the same configuration as the first operation unit 425. The first master signal generator 426 may comprise, for example, a flip-flop which outputs its input signal in response to the clock signal CLK.

The combinational logic unit 427 is a gate circuit that outputs the first master signal MAS1 as the first operation signal OPS1.

The transmission controller 440 transmits the first operation signal OPS1 as a first control signal CTRL1 to the next circuit, for example memory core circuit 450, in response to the clock signal CLK. The transmission controller 440 includes a flip-flop 446 which receives the first operation signal OPS1 and outputs it as the first control signal CTRL1 at the next cycle, in response to the clock signal CLK.

The first control signal CTRL1 is then applied to the memory cell (not shown) of the memory core 450, and senses the current level.

If another command of the commands defined in FIG. 2 is input as the packet command PACOM to the command decoder 410, the command decoder 410 decodes the input packet command PACOM and generates a corresponding second command COM2 and a third command COM3.

If the input packet command PACOM is decoded and the third command COM3 is generated, the third command COM3 is applied to a third operation unit 435 of the operation controller 420. Then, the third operation unit 435 generates a third operation signal OPS3, and the third operation signal OPS3 is applied as a third control signal CTRL3 to the memory core 450 by the flip-flop 448 of the transmission controller 440.

It is assumed, in this example, that a packet command, such as a refresh command, for sensing the current of the memory cells of the memory core and a packet command for pre-charging a selected memory cell are simultaneously input to the command decoder 410. It is also assumed that the packet command for sensing the current of the memory cells of the memory core is decoded and generated as a first command COM1, and the packet command for pre-charging the selected memory cell is decoded and generated as a second command COM2.

Thus, in this example, the first master signal MAS1 and the second master signal MAS2 are activated simultaneously.

Figure 6:
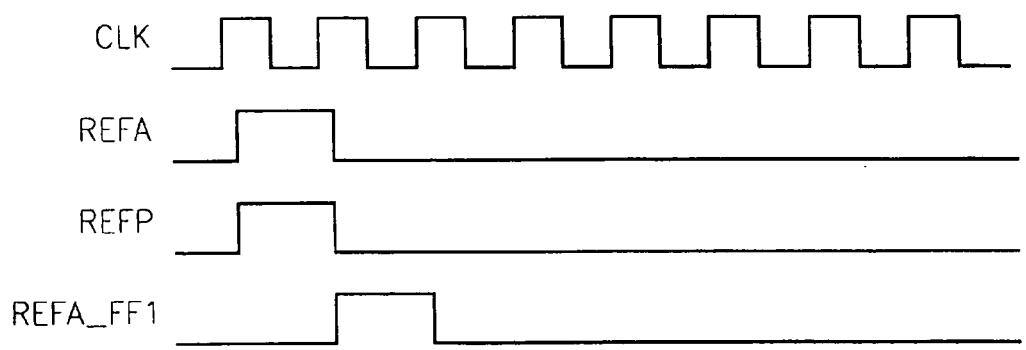
FIG. 6 is a timing diagram for describing the operation of the conventional interfacing circuit in the case where first and second commands are applied simultaneously.

FIG. 6 is a timing diagram for describing the operation of the conventional interfacing circuit in the case where the first and second commands are applied simultaneously. The first master signal MAS1 is denoted by REFA in FIG. 6, and the second master signal MAS2 is denoted by REFP in FIG. 6.

REFA_FF1 represents a first control signal CTRL1 input to the memory core 450. Accordingly, the memory core 450 performs the sensing operation of the cell current and the pre-charging operation of the memory cell simultaneously. As a result, the memory core 450 is operated incorrectly.

Furthermore, because the cell current is still sensed, even though the memory core 450 is operated incorrectly, the problem of an increase of current consumption exists.

In this regard, the present invention comprises a reset signal generator 445 which generates a reset signal for preventing a first memory operation, for example, a sensing operation of the cell current of the memory core, when other commands that would otherwise incorrectly operate the memory core, are generated simultaneously with the sensing operation command.

As stated above, the first master signal MAS1, the first operation signal OPS1, and the first control signal CTRL1 are the same signal, for example, for activating a sensing operation of the memory core 450.

The sensing operation command signal is denoted by REFA in FIG. 2. The other master signals are denoted by REFP, PDNR, NAPR, NAPRC, TCEN, and TCAL in the command list of FIG. 2. The master signals incorrectly operate the circuit receiving the first through N-th control signals CTRL1, CTRL2, and CTRL3, that is, the memory core 450, when the master signals are activated simultaneously with the first master signal MAS1. As shown in FIG. 5, when one of the other master signals MAS2, MAS3 are activated simultaneously with the first master signal MAS1, the reset signal RESET is activated, which prevents the first control signal CTRL1 from being applied to the memory core 450 while the other of the control signals is applied CTRL2, CTRL3.

The command list of FIG. 2 exhibits that the memory core 450 is incorrectly operated if a REFA command for sensing the current of the memory cells is activated simultaneously with an REFP, a PDNR, an NAPR, an NAPRC, a TCEN, or a TCAL command.

In this example, the third switching unit 530 comprises a plurality of NMOS transistors MNS1 through MNS6 having gates to which the master signals REFP, PDNR, NAPR, NAPRC, TCEN, TCAL are applied respectively, and which are connected in a parallel manner between the first node N1 and the second node N2, wherein the master signals incorrectly operate the circuit 450 receiving the first through N-th control signals CTRL1, CTRL2, and CTRL3 when the master signals are activated simultaneously with the first master signal MAS1.

The reset controller 540 generates the reset signal RESET when the master signals REFP, PDNR, NAPR, NAPRC, TCEN, and TCAL are activated simultaneously with the first master signal MAS1, wherein the master signals incorrectly operate the circuit 450 receiving the first through N-th control signals CTRL1, CTRL2, and CTRL3 when the master signals are activated simultaneously with the first master signal MAS1, in response to a signal NS1 output from the first node N1, the inverted signal MAS1_B of the first master signal MAS1, and a reset control signal RESET_CTRL.

More specifically, as described above, the reset controller 540 includes a NOR means 545, a first inverter 550, and an NMOS transistor 555. The NOR means 545 performs a NOR operation on the signal NS1 output from the first node N1 and the inverted signal MAS1_B of the first master signal MAS1 and outputs it as a reset signal RESET. The first inverter 550 inverts the reset signal RESET, which is applied to the first node N1. The NMOS transistor 555 connects an output node N3 of the NOR means 545 with the ground voltage VSS, in response to the reset control signal RESET_CTRL.

The reset control signal RESET_CTRL, as a pulse-type signal, is initially applied at a high level to the gate of the NMOS transistor 555. Accordingly, the output node N3 of the NOR means 545 becomes low.

The reset signal RESET is generated at the output node N3 of the NOR means 545. Referring to FIGS. 4 and 5, an inverted signal RESET_B of the reset signal RESET is applied to a first flip-flip 446 of the transmission controller 440 to reset the first flip-flop 446.

Although FIG. 4 illustrates a case where the first flip-flop 446 of the transmission controller 440 is reset in response to the inverted signal RESET_B of the reset signal RESET, a circuit that resets the first flip-flop 446 in response to the non-inverted reset signal RESET is equally applicable to the present invention.

If the reset control signal RESET_CTRL is high, the first node N1 stays high. At this time, in the case where a command defined in the command list of FIG. 2 is input, for example, in the case where the REFA command being a command for sensing the current of the memory cells of the memory core 450, is activated as a first master signal MAS1, the second node N2 becomes low in response to the activation of the NMOS transistor of the second switching unit 520.

However, at the same time, because the first switching unit 510 receiving the inverted signal MAS1_B of the first master signal MAS1 is activated by the signal output by inverter 505, the first node N1 remains at a high level.

If the output signal NS1 of the first node N1 at a high level and the inverted signal MAS1_B of the first master signal MAS1 are input to the NOR means 545 of the reset controller 540, the reset signal RESET becomes low and the inverted signal RESET_B of the reset signal RESET becomes high. Accordingly, the first flip-flop 446 of the transmission controller 440 is not reset.

In the case where another command, for example, one of PDNR, NAPR, NAPRC, REFP, etc. defined in the command list of FIG. 2 is input without the input of the REFA command, the first node N1 stays high and the inverted reset signal RESET_B also stays high. Therefore, the first flip-flop 446 of the transmission controller 440 is not reset.

If the commands such as PDNR, NAPR, NAPRC, REFP, TCEN, TCAL are activated simultaneously with the REFA command, wherein the commands incorrectly operate the memory core when activated simultaneously with the REFA command in the command list of FIG. 2, the second switching unit 520 and the third switching unit 530 are turned on and the first node N1 becomes low.

In this case, because both the output signal NS1 of the first node N1 input to the NOR means 545 and the inverted master signal MAS1_B become low, the reset signal RESET becomes high and the reverse signal RESET_B of the reset signal RESET becomes low.

Accordingly, the first flip-flop 446 of the transmission controller 440 is reset, thereby preventing the first operation signal OPS1 as the first control signal CTRL1 from being applied to the memory core 450. Therefore, because the first control signal CTRL1 for sensing the current of the memory cells is not applied to the memory core although the memory core is incorrectly operated, it is possible to prevent excessive current from flowing to the memory core 450.

FIG. 6 is a timing diagram for describing the operation of the interfacing circuit in accordance with the present invention, in the case where the first and second commands are applied simultaneously.

Figure 7:
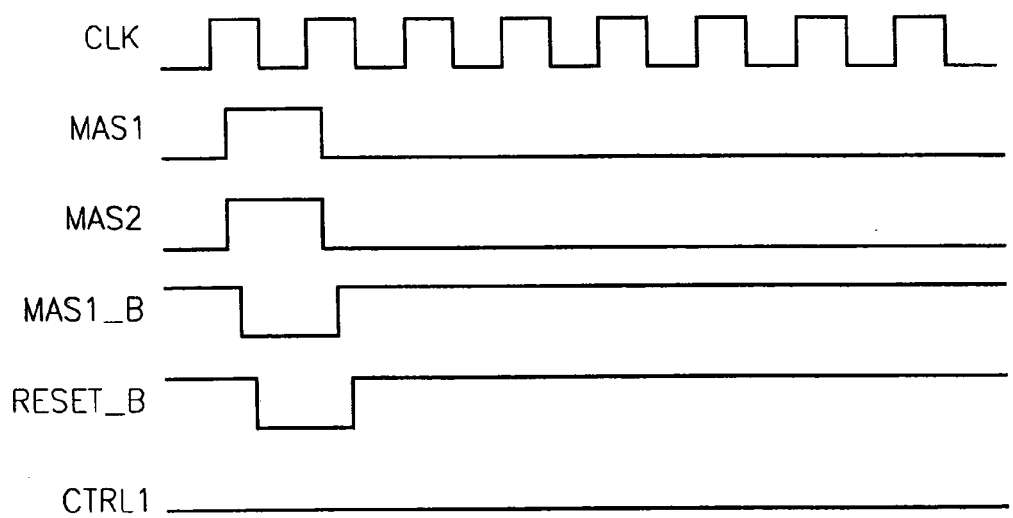
FIG. 7 is a timing diagram for describing the operation of the interfacing circuit according to the present invention in the case where first and second commands are applied simultaneously.

Referring to FIG. 7, in a case where the REFA command, which is the command for sensing the current of the memory cells of the memory core 450, is activated as the first master signal MAS1, and simultaneously, one among the PDNR, NAPR, NAPRC, REFP, TCEN, and TCAL commands is activated as a second master signal MAS2, the reverse signal RESET_B of the reset signal RESET is generated at a low level to reset the first flip-flop 446 of the transmission controller 440, thereby preventing activation of the first control signal CTRL1.

As described above, the interfacing circuit according to the present invention offers the advantage of preventing the flow of excessive current to the memory device, although simultaneous commands in the command list are received, one of the commands being a command related to the sensing of current of the memory cells in the memory device.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. An interfacing circuit comprising:
   a command decoder which decodes an input packet command and generates first through N-th commands;
   an operation controller which generates first through N-th operation signals for performing operations corresponding to the commands in response to a clock signal; and
   a transmission controller which transmits the first through N-th operation signals as first through N-th control signals in response to the clock signal,
   wherein the transmission controller comprises a reset signal generator which generates a reset signal for interrupting the transmission of the first control signal, when multiple commands of the first through N-th commands are generated simultaneously.

2. The interfacing circuit of claim 1, wherein the operation controller comprises first through N-th operation units which receive the first through N-th commands output from the command decoder and generate the first through N-th operation signals.

3. The interfacing circuit of claim 2, wherein each of the first through N-th operation units comprises:
   a master signal generator which receives and outputs a corresponding command as a master signal in response to the clock signal; and
   a combinational logic unit which generates a corresponding operation signal in response to the master signal,
   wherein the first operation unit includes a first master signal generator which receives and outputs a corresponding command as a first master signal in response to the clock signal.

4. The interfacing circuit of claim 3, wherein the reset signal generator comprises:
   a first switching unit which connects a source voltage to a first node in response to an inverted signal of the first master signal;
   a second switching unit which connects a ground voltage to a second node in response to the first master signal;
   a third switching unit which connects the first node to the second node when any of the master signals other than the first master signal is activated; and
   a reset controller which generates the reset signal when any of the master signals other than the first master signal is activated simultaneously with the first master signal, in response to a signal at the first node, the inverted signal of the first master signal, and a reset control signal.

5. The interfacing circuit of claim 4, wherein the first switching unit is a PMOS transistor having a gate to which the inverted signal of the first master signal is applied, and the second switching unit is an NMOS transistor having a gate to which the first master signal is applied.

6. The interfacing circuit of claim 4, wherein the third switching unit is comprised of a plurality of NMOS transistors, each having a gate to which the master signals other than the first master signal are applied respectively, and which are connected in parallel between the first node and the second node.

7. The interfacing circuit of claim 4, wherein the reset controller comprises:
   a NOR means which performs a NOR operation on a signal at the first node and an inverted signal of the first master signal to be output as the reset signal;
   a first inverter between an output node of the NOR means and the first node which inverts the reset signal to apply to the first node; and
   an NMOS transistor which connects the output node of the NOR means to a ground voltage in response to the reset control signal.

8. The interfacing circuit of claim 3, wherein the first master signal, the first operation signal, and the first control signal are the same signal for activating a sensing operation of a memory core.

9. The interfacing circuit of claim 1, further comprising a memory core of a semiconductor memory receiving the first through N-th control signals.

10. The interfacing circuit of claim 1, wherein the transmission controller comprises first through N-th flip-flops which output the first through N-th operation signals as the first through N-th control signals, respectively, in response to the clock signal.

11. The interfacing circuit of claim 1 installed in a Rambus DRAM.

12. The interfacing circuit of claim 1 wherein the commands incorrectly operate a circuit receiving the first through N-th control signals when the multiple commands are generated simultaneously, if the transmission of the first control signal was activated.

13. The interfacing circuit of claim 1 wherein the first control signal activates a sensing operation of a memory core.

* * * * *